United States Patent [19]

Gross, Jr. et al.

[11] Patent Number: 5,534,862
[45] Date of Patent: Jul. 9, 1996

[54] RESISTOR STRING WITH EQUAL RESISTANCE RESISTORS

[75] Inventors: George F. Gross, Jr., Reading; Richard J. McPartland, Nazareth; Thayamkulangara R. Viswanathan, Albany Township, Berks County, all of Pa.

[73] Assignee: AT&T Corp., Murray Hill, N.J.

[21] Appl. No.: 431,694

[22] Filed: Apr. 28, 1995

Related U.S. Application Data

[63] Continuation of Ser. No. 327,173, Oct. 21, 1994.

[51] Int. Cl.$^6$ .................................................. H03M 1/78
[52] U.S. Cl. .......................................... 341/144; 341/154
[58] Field of Search ..................................... 341/144, 136, 341/145, 154, 153

[56] References Cited

U.S. PATENT DOCUMENTS 5,059,978  10/1991  Valdenaire ............................... 341/145
5,416,482   5/1995  Veki ........................................ 341/136

FOREIGN PATENT DOCUMENTS

| A-0196050 | 3/1986 | European Pat. Off. | ........ H01L 21/31 |
| 0354448 | 8/1989 | European Pat. Off. | ......... H03M 1/36 |
| A-3933956 | 10/1989 | Germany | ..................... H01C 1/082 |
| 58-219877 | 6/1985 | Japan | ............................ H03M 1/36 |

*Primary Examiner*—Brian K. Young
*Attorney, Agent, or Firm*—David L. Smith

[57] ABSTRACT

There is disclosed an integrated circuit including a resistive material runner resistor string comprising a series of resistors in which each resistor includes at least one runner direction change feature. Each resistor includes first and second contiguous elements. The junction of the first and second elements form a direction change feature such as a corner in the runner of the resistor string. Taps are positioned along the resistor string at substantially equal resistance intervals. The first and second elements may be squares of different edge dimensions. The resistor string is useful in applications such as digital-to-analog converters.

28 Claims, 5 Drawing Sheets

5,534,862

RESISTOR STRING WITH EQUAL RESISTANCE RESISTORS

This application is a Rule 1.53 continuation of our copending application Ser. No. 08/327173 filed on Oct. 21, 1994.

TECHNICAL FIELD

This invention relates generally to integrated circuits having resistor strings with equal resistance resistors, and more particularly to digital-to-analog converters (DACs) having such a resistor string.

BACKGROUND OF THE INVENTION

DACs are used to convert a digitally coded signal to an analog signal, or in conjunction with successive approximation circuitry as part of an analog-to-digital converter. DACs convert a digitally coded signal to an analog signal, typically a voltage, that corresponds to the digitally coded signal. The analog signal can take on many different values over a predetermined range that corresponds to the range of digitally coded signals.

DACs may employ a resistor string comprised of series coupled equal resistance resistors. Between contiguous resistors in the resistor string, as well as between the resistor string and an energy source energizing the resistor string, are intermediate taps. Switches, coupled between an output node and intermediate taps, when turned on electrically couple the respective intermediate taps to the output node, and isolate the intermediate taps from the output node when turned off.

The precision with which resistors are formed affects the precision of the resulting analog signal. A shortcoming of prior art DACs has been the difficulty of fabricating a resistor string in which each resistor has the same resistance, particularly in applications where the resistor string layout includes one or more direction reversals. Direction reversals are introduced to constrain a resistor string to an area on an integrated circuit that results in a chip with an acceptable aspect ratio. Inaccuracy in fabricating the resistors results in incorrect analog signals being produced at the output of a DAC.

SUMMARY OF THE INVENTION

In accordance with an illustrative embodiment of the present invention, an integrated circuit includes a resistor string comprising a plurality of resistors connected in series providing a current path. Each resistor includes first and second contiguous elements. The junction of the first and second elements form a layout direction change feature in the layout of the resistor string. Taps are positioned along the resistor string at substantially equal resistance intervals. In one embodiment of the invention, the first and second elements may be squares of different edge dimensions. The resistor string is useful in applications such as digital-to-analog converters.

DETAILED DESCRIPTION

Figure 1:
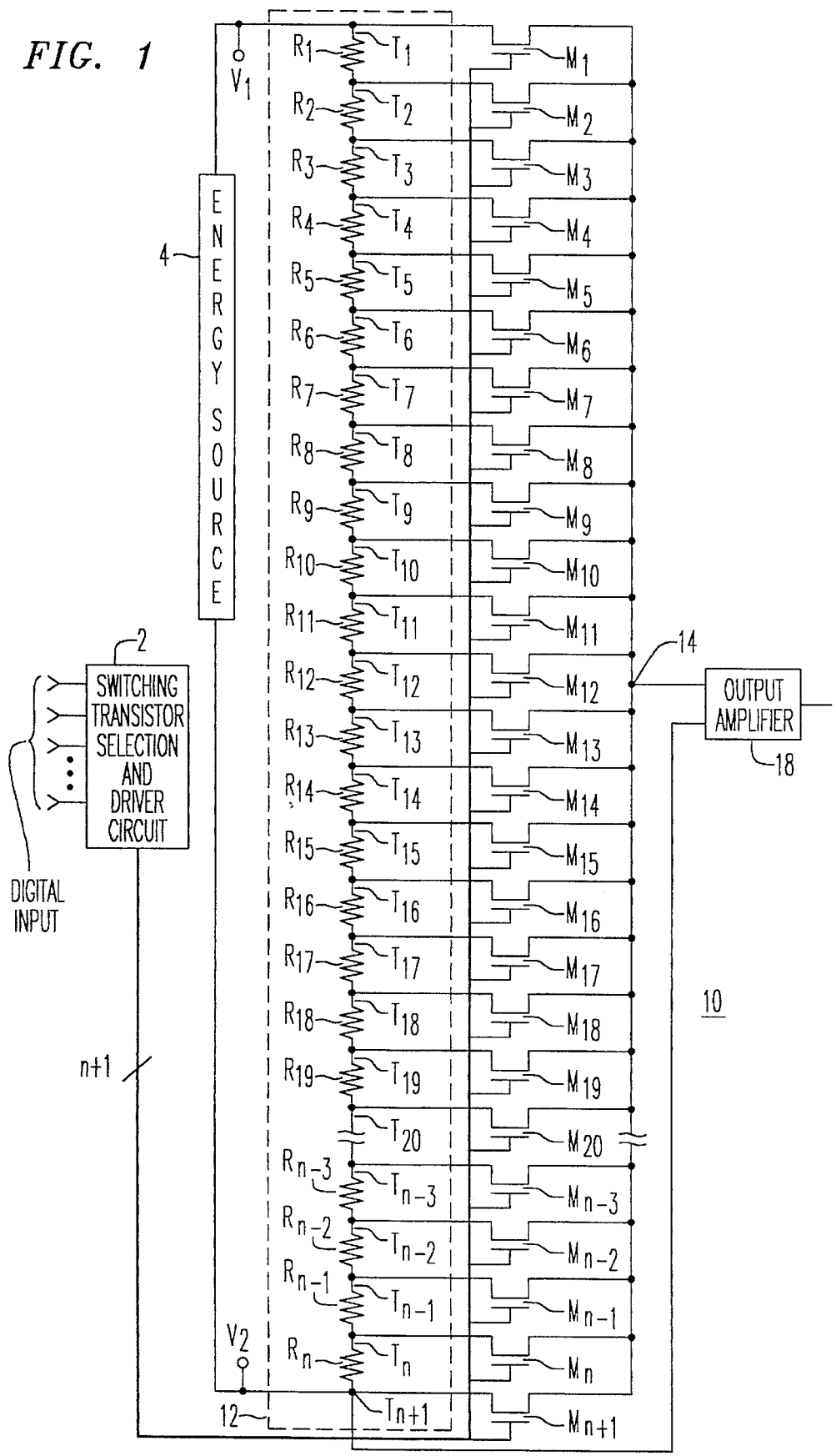
FIG. 1 is a schematic diagram of a digital-to-analog converter in accordance with an illustrative embodiment of the present invention.

The schematic diagram of a DAC 10 incorporating an illustrative embodiment of the present invention is shown in FIG. 1. DAC 10 includes a resistor string coupled across an energy source. Switches couple intermediate taps to a common output node. The magnitude of an analog voltage appearing at the output node depends upon which switch or switches are turned on. The output may be amplified by an output amplifier which may convert the output to another form. A resistor string in accordance with the present invention is suitable for fabrication in the form of a monolithic integrated circuit.

Resistor string 12 is comprised of a series of resistors. The number of resistors is designated as n, a user determined number. The resistors are denoted $R_1$ through $R_n$. The resistance of the resistors comprising the resistor string are application dependent. The resistance of each resistor $R_1$ through $R_n$ will be readily selected by one skilled in the art based on a variety of parameters such as the power to be dissipated, the potential across the resistor string, and the number of resistors in the resistor string.

In an illustrative embodiment, the resistor string is a continuous thin film metal runner 8 that has a sheet resistance per square of metal. A typical sheet resistance value is on the order of 0.04 ohms per square. The resistor string is typically a thin film metal resistor network of aluminum on a silicon integrated circuit. Taps extend from the metal runner at substantially equal resistance intervals. In FIG. 1 of the illustrative embodiment, the resistor string 12 is shown coupled between two reference potential values, $V_1$ and $V_2$. Resistor string 12 is energized by an energy source 4 that may be either a voltage or current source. For single-ended mode operation, $V_1$ may be substantially the power supply voltage, and $V_2$ may be ground potential.

Switches $M_1$ through $M_{n+1}$ are coupled between corresponding intermediate taps $T_1$ through $T_{n+1}$ and output node 14. In the illustrative embodiment the switches are MOS transistors. Switching transistors $M_1$ through $M_{n+1}$ are controlled by switching transistor selection and driver circuit 2, as is known in the art. Transient capacitor-charging currents due to transistors $M_1$ through $M_{n+1}$ being switched are allowed to go to zero or the circuit is allowed to settle.

DAC 10 includes a large number of resistors in resistor string 12. The resistor string layout may include a direction reversal, or in some cases many direction reversals, which increases the difficulty of maintaining the resistance of all of the resistors in the string the same. Ideally, a voltage gradient is produced across the resistor string in which the differential voltage across each resistor in the resistor string is substantially identical. Since the current through the resistor string is common to all of the resistors in the resistor string, for the differential voltage across each resistor to be substantially identical, the resistance of each resistor must be substantially identical to the resistance of the other resistors. An intermediate tap, $T_1$ through $T_{n+1}$, is provided at substantially equal resistance intervals along resistor string 12, preferably at a location that is not in the current path. In this manner, the presence of an intermediate tap does not affect current flow through the resistor string.

Figure 2:
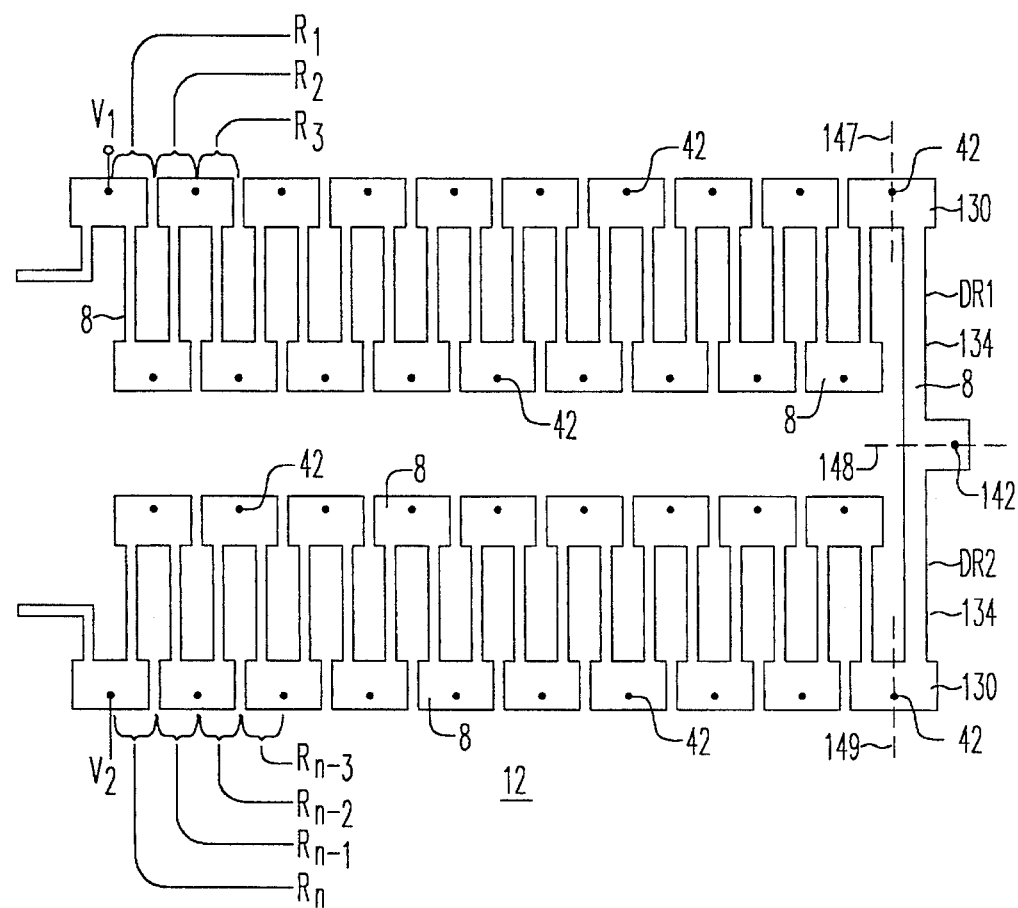
FIG. 2 is a layout diagram of a resistor string in accordance with an illustrative embodiment of the invention.

FIG. 2 shows an illustrative embodiment of a representative portion of a resistor string 12 including a direction reversal in runner 8. Each resistor $R_1$ through $R_n$ is constructed so it has the same geometric features as the other resistors. The geometric shape of each resistor includes at least one shorter element of conductive material and one longer element of conductive material. Each resistor includes at least one geometric feature that causes the runner to change direction.

Figure 3:
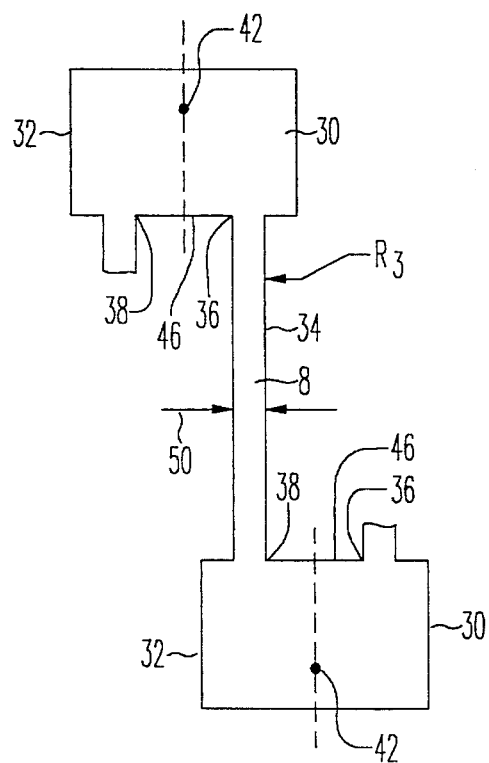
FIG. 3 is an enlarged view of a string resistor and two contiguous intermediate taps from FIG. 2.

Resistor $R_3$, shown enlarged in FIG. 3, is typical of the resistors that are not direction reversing resistors in runner 8. Each such resistor has the same area, at least one feature that causes the runner to change direction, and the same resistance. In the illustrative embodiment, the feature that causes the runner to change direction is a corner which substantially causes the runner to change directions by 90°. Each nondirection reversing resistor includes two shorter elements 30 and 32 of conductive material, interconnected by a longer element 34 of conductive material. Each resistor includes at least one corner 36 or 38. The resistors that are not direction reversing resistors in runner 8 include two corners 36 and 38, one each at the intersection of the shorter elements 30 and 32 with the longer element 34. The resistors that are not direction reversing resistors in runner 8 have corners where the shorter first and second elements 30 and 32 extend in opposite directions from the longer element 34. In this manner, the current flowing through resistor string 12 encounters the same resistance and current flow characteristics in each such resistor.

At the intermediate taps, a conductive line (not shown) interconnects to the resistor string by way of a connection or via 42. The conductive line is on a layer above or below the resistor string in the integrated circuit and couples to intermediate taps by way of vias 42. Vias 42 and the conductive lines are used to sense the voltage at each of the intermediate taps. Via 42 is positioned at the junction of the shorter first element 30 of one resistor and the shorter second element 32 of a contiguous resistor in resistor string 12. Via 42 is positioned in the combined structure of the shorter first element 30 of one resistor and the shorter second element 32 of a contiguous resistor, out of the current flow path and therefore away from corners 36 and 38. In this manner, current flowing through longer element 34 of one resistor, around corner 38 into shorter second element 32, into shorter first element 30 of a contiguous resistor, and around corner 36 into longer element 34 of the contiguous resistor in resistor string 12 is not altered by the presence of via 42.

Figure 4:
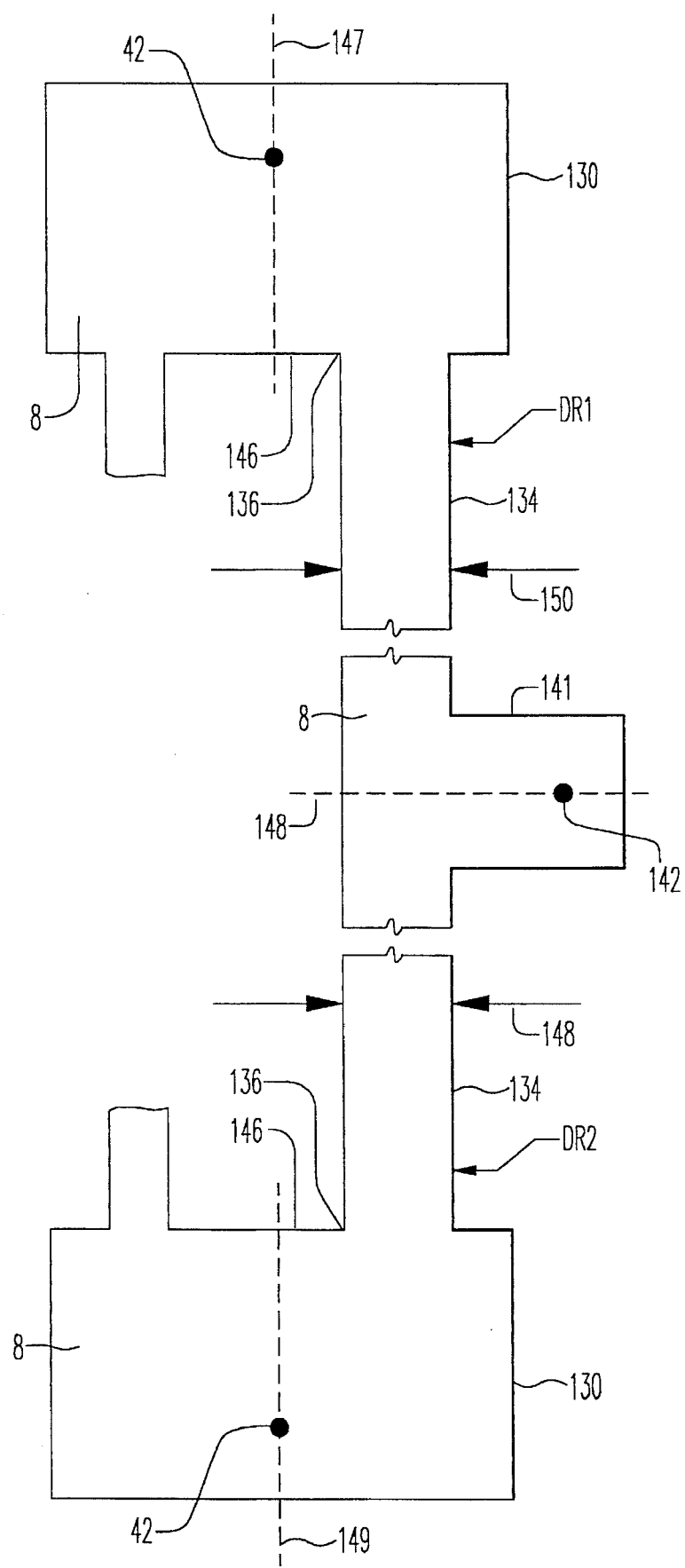
FIG. 4 is an enlarged view of the direction reversing resistors shown in FIG. 2, along with contiguous intermediate taps.

FIG. 4 shows the direction reversal resistors in runner 8 enlarged from the view in FIG. 2. Direction reversal resistors DR1 and DR2 in runner 8 are proportionately larger to maintain substantially the same resistance as the resistors that are not direction reversing resistors in runner 8. The width 150 of longer element 134 is greater than the width 50 (FIG. 3) of longer element 34. The length of longer element 134 from corner 136 to line segment 148 is greater than the corresponding length of longer element 34 (FIG. 3) from edge 46 near corner 36 to edge 46 near corner 38. The length and width of longer element 134 are proportionately larger than the corresponding length and width of longer element 34, such that the resistance of longer element 134 is substantially the same as the resistance of longer element 34. Each runner 8 direction reversing resistor includes a corner 136. Corner 136 in the illustrative embodiment contributes to reversing the direction of runner 8. Shorter element 130 may be wider than shorter element 30 (FIG. 3) to accommodate the width 150 of longer element 134. A via 142 is positioned on metal extension 141 of runner 8 between the runner 8 direction reversing resistors DR1 and DR2, out of the current flow path.

Figure 5:
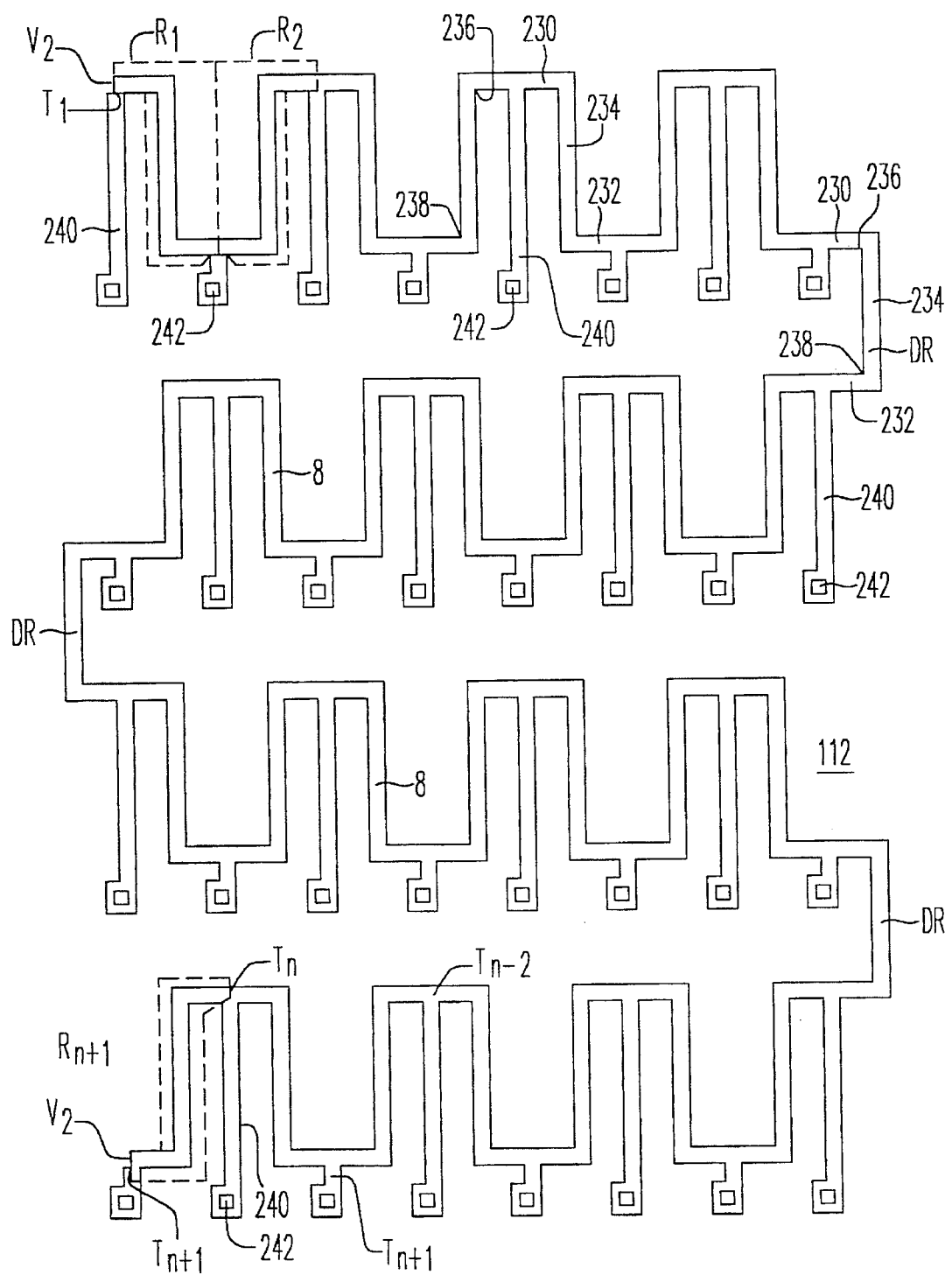
FIG. 5 is a layout diagram of an alternate illustrative embodiment of a thin film resistor string.

A layout diagram of an alternate illustrative embodiment thin film resistor string 112 is shown in FIG. 5. The resistor string serpentines boustrophedonically back and forth across the layout, with several direction reversals. Each of the resistors is comprised of the same geometric features. Each of the resistors includes two short elements interconnected by a long element. Each of the resistors also includes features to cause the runner 8 to change direction from a first direction, for example along element 230, to a second direction substantially perpendicular to the first direction, for example along element 234. The runner 8 then changes direction again to pass in a third direction which is substantially parallel to the first direction, for example along element 232. In the illustrative embodiment, this is achieved with two corners. In this manner, the current flowing through resistor string 112 encounters the same resistance in each resistor because of the same geometry of runner 8 in each resistor.

Each resistor in resistor string 112 is comprised of two shorter elements 230 and 232 of conductive material interconnected by a longer element 234 of conductive material. Each resistor includes two corners 236 and 238, one each at the intersection of the shorter elements 230 and 232 with the longer element 234. While most of the resistors have corners where the shorter elements 230 and 232 extend in opposite directions from the longer element 234, the resistors, DR, in the direction reversal positions have corners where the shorter elements 230 and 232 extend in the same direction from longer element 234. An extension 240 in runner 8 extends from each intermediate tap $T_1$ through $T_{n+1}$ to proximate a terminal of a switching device, such as a transistor. A via 242 in extension 240 couples each metal extension to a transistor which may be formed in layers above or below the resistor string 112.

Figure 6:
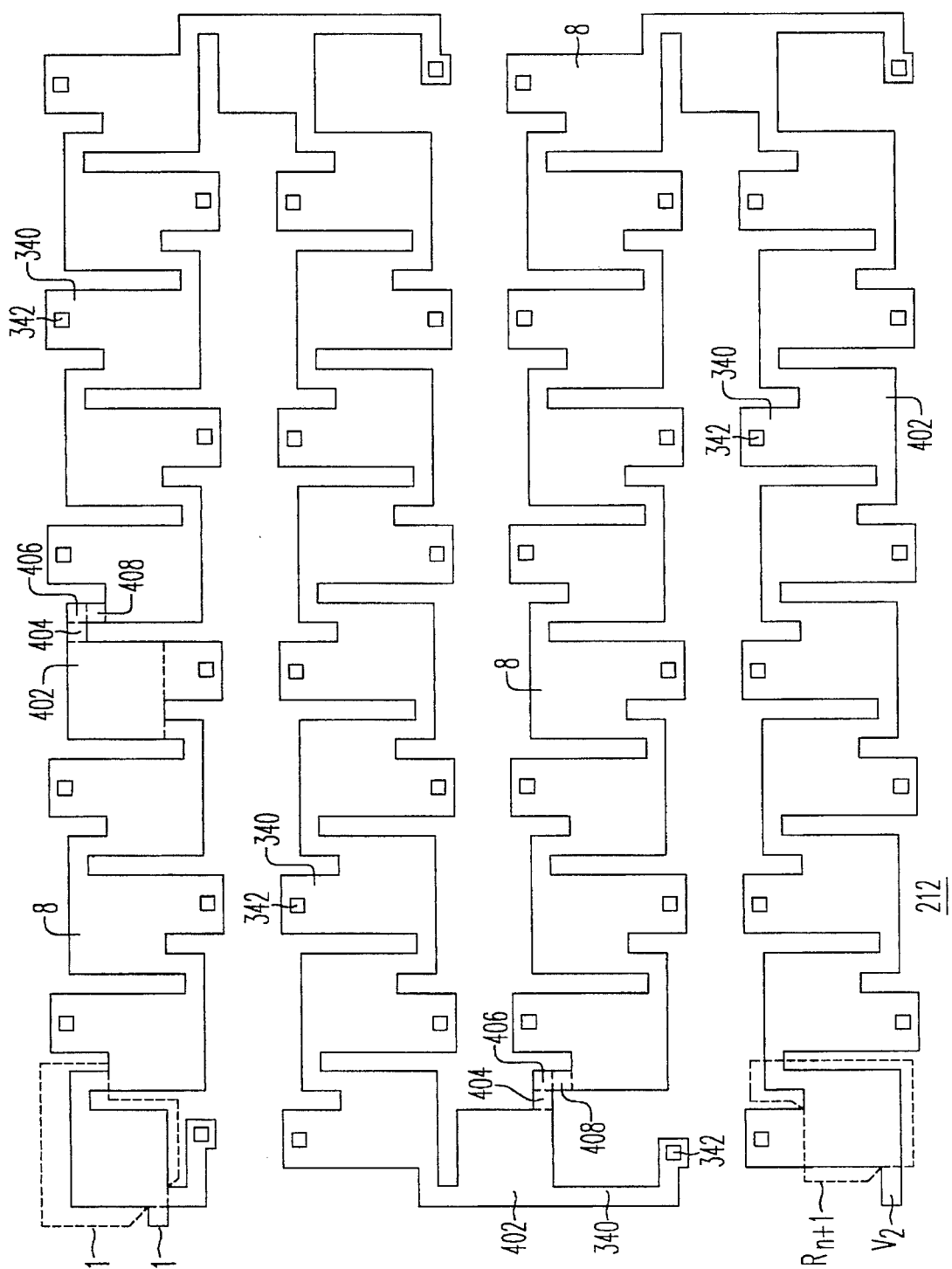
FIG. 6 is a layout diagram of an alternate illustrative embodiment of a thin film resistor string.

A layout diagram of an alternate illustrative embodiment is shown in FIG. 6. In this illustrative embodiment, the resistor string 212 serpentines back and forth across the layout, and includes several direction reversals. Each resistor is constructed of the same geometric features and includes at least one feature that causes the runner to change direction, such as a corner. Each resistor has a shape which is capable of being topologically reduced to a series of contiguous squares.

The sheet resistance of a square of uniform thickness metal is constant, without regard to the length of an edge of the square. Configuring resistors out of a plurality of squares of such metal results in resistors of identical resistance even though the geometric configuration of each resistor is not identical, and even though the squares of metal may differ in size.

Each resistor $R_1$ through $R_{n+1}$ in FIG. 6 is configured from the same elements, 402, 404, 406 and 408, in various arrangements. In the illustrative embodiment, the elements are squares with four squares forming each resistor. Also in the illustrative embodiment, elements 404, 406, and 408 are identical in edge dimensions. The invention is not so limited. While each resistor in resistor string 212 is described as being configured from individual elements, it is understood that the resistors form a continuous runner.

When a square with a larger edge dimension is located adjacent to a square with a smaller edge dimension, a runner direction change or corner is formed. Each resistor $R_1$ through $R_{n+1}$ includes at least one such runner direction change or corner.

Extension 340 extends from resistor string 212 at intermediate locations to provide a tap to a terminal of a switching device such as a transistor. A via 342 couples each extension to a transistor which may be formed in the integrated circuit in layers above or below the resistor string 212.

The invention is particularly useful in communication systems and equipment employing integrated circuits in digital-to-analog and analog-to-digital converter applications. Such communication systems and equipment have the advantage of precisely converting a digitally coded signal to a corresponding analog signal, or precisely converting an analog signal to a corresponding digitally coded signal.

While the illustrative embodiment of the invention has been described as including a runner direction changing feature such as a corner, a runner direction change that is not 90° will suffice. To achieve the same runner direction change, two or more such features may be necessary in each resistor. Furthermore, while the illustrative embodiment has disclosed resistors comprised of straight elements, the elements could take other shapes, such as curvilinear. The resistors of the illustrative embodiment were described as being fabricated of a metal such as aluminum. The invention is not so limited. The resistors may be fabricated at a predetermined level of integrated circuit fabrication. A resistor string may be fabricated of resistive materials such as doped or undoped polysilicon, metal such as aluminum or tungsten, or a layered combination of materials, such as, for example, polysilicon covered by metals such as aluminum or tungsten, or polysilicon covered by a nitride. Blanket layers may be deposited and then subsequently patterned in the shape desired.

We claim:

1. An integrated circuit including a resistive material runner resistor string having at least one runner direction reversal, comprising:

a plurality of serially coupled resistors providing a current path, each of said resistors having a first element and a second element, the first and second elements being contiguous and forming at the juncture thereof a runner direction change feature, the resistor string having taps at substantially equal resistance intervals, whereby each resistor in the resistor string includes a runner direction change feature with the runner direction change feature in at least one resistor facilitating the direction reversal.

2. An integrated circuit as recited in claim 1, wherein the first element comprises a shorter element and the second element comprises a longer element, the shorter element adjacent to a first end of the longer element.

3. An integrated circuit as recited in claim 2, further comprising:

at least one of the resistors in the resistor string having a second shorter element, the second shorter element of said at least one resistor coupled to a second end of the longer element and forming a second runner direction change feature is therewith, whereby at least one of the resistors in the resistor string includes a second runner direction change feature in the current path.

4. An integrated circuit as recited in claim 3, wherein at least one resistor has direction change features with the first and second shorter elements extending in opposite directions from the longer element.

5. An integrated circuit as recited in claim 3, wherein at least one resistor has direction change features with the first and second shorter elements extending in the same direction from the longer element.

6. An integrated circuit as recited in claim 1, wherein the first element comprises a square having an edge with a first edge dimension and the second element comprises a square having an edge with a second edge dimension, the first and second edge dimensions being different, the first and second elements being contiguous, and forming at the juncture thereof a runner direction change feature, whereby each resistor in the resistor string includes a runner direction change feature in the current path with the runner direction change feature in at least one resistor facilitating the runner direction reversal.

7. An integrated circuit as recited in claim 6, further comprising a third element, said third element comprising a square having an edge with a third edge dimension, the edge of said third element contiguous with an edge of one of said first or second elements.

8. An integrated circuit as recited in claim 6, further comprising a fourth element, said fourth element comprising a square having an edge dimension, an edge of said fourth element being contiguous with an edge of one of said first, second, or third elements, the edge dimension of said fourth element being the same as the edge dimension of said second and third elements.

9. An integrated circuit including a digital-to-analog converter, comprising:

a resistor string providing a current path having at least one runner direction reversal, the resistor string having intermediate taps and comprising a plurality of resistors, each of the resistors having a first element and a second element, the first element contiguous with the second element and forming a runner direction change feature therewith in the current path, whereby each resistor in the resistor string includes a runner direction change feature with the runner direction change feature in at least one resistor facilitating the at least one runner direction reversal;

switching transistors, the switching transistors coupled between a respective intermediate tap and an output node; and a selection circuit coupled to a terminal of each transistor for selectively switching transistors to a predetermined state, the selection circuit capable of switching a least one switching transistor to the predetermined state to produce an analog output at the output node.

10. An integrated circuit as recited in claim 9, wherein the number of switching transistors corresponds to the number of intermediate taps.

11. An integrated circuit as recited in claim 9, wherein the first element comprises a shorter element and the second element comprises a longer element, the shorter element adjacent to a first end of the longer element.

12. An integrated circuit as recited in claim 11, further comprising:

at least one of the resistors in the resistor string having a second shorter element, the second shorter element of said at least one resistor coupled to a second end of the longer element and forming a second direction change feature therewith, whereby at least one of the resistors in the resistor string includes a second runner direction change feature in the current path.

13. An integrated circuit as recited in claim 12, wherein at least one resistor has direction change features with the first and second shorter elements extending in opposite directions from the longer element.

14. An integrated circuit as recited in claim 12, wherein at least one resistor has direction change features with the first and second shorter elements extending in the same direction from the longer element.

15. An integrated circuit as recited in claim 9, wherein the first element comprises a square having an edge with a first edge dimension and the second element comprises a square having an edge with a second edge dimension, the first and second edge dimensions being different, the first and second elements being contiguous, and forming at the juncture thereof a runner direction change feature, whereby each resistor in the resistor string includes a runner direction change feature with the runner direction change feature in at least one resistor facilitating the runner direction reversal.

16. An integrated circuit as recited in claim 15, further comprising a third element, said third element comprising a square having an edge with a third edge dimension, an edge of said third element contiguous with an edge of one of said first or second elements.

17. An integrated circuit as recited in claim 15, further comprising a fourth element, said fourth element comprising a square having an edge dimension, an edge of said fourth element being contiguous with an edge of one of said first, second, or third elements, the edge dimension of said fourth element being the same as the edge dimension of said second and third elements.

18. An integrated circuit as recited in claim 1, wherein the resistive material comprises a metal.

19. An integrated circuit as recited in claim 1, wherein the resistive material comprises aluminum.

20. An integrated circuit as recited in claim 1, wherein the resistive material comprises tungsten.

21. An integrated circuit as recited in claim 1, wherein the resistive material comprises doped polysilicon.

22. An integrated circuit as recited in claim 1, wherein the resistive material comprises undoped polysilicon.

23. An integrated circuit as recited in claim 1, wherein the resistive material comprises a layered combination of materials.

24. An integrated circuit as recited in claim 23, wherein the layered combination of materials comprises polysilicon.

25. An integrated circuit as recited in claim 23, wherein the layered combination of materials comprises polysilicon covered by a nitride.

26. An integrated circuit as recited in claim 23, wherein the layered combination of materials comprises polysilicon covered by a metal.

27. An integrated circuit as recited in claim 26, wherein the metal comprises aluminum.

28. An integrated circuit as recited in claim 26, wherein the metal comprises tungsten.

* * * * *